US012635585B2

(12) United States Patent
Chen

(10) Patent No.: US 12,635,585 B2
(45) Date of Patent: May 19, 2026

(54) DISPLAY PANEL AND DISPLAY APPARATUS

(71) Applicant: Shanghai Tianma Micro-Electronics Co., Ltd., Shanghai (CN)

(72) Inventor: Haijing Chen, Shanghai (CN)

(73) Assignee: SHANGHAI TIANMA MICROELECTRONICS CO., LTD., Shanghai (CN)

( * ) Notice: Subject to any disclaimer, the term of this patent is extended or adjusted under 35 U.S.C. 154(b) by 398 days.

(21) Appl. No.: 18/344,155

(22) Filed: Jun. 29, 2023

(65) Prior Publication Data

US 2023/0343761 A1      Oct. 26, 2023

(30) Foreign Application Priority Data

Apr. 28, 2023    (CN) .......................... 202310483805.5

(51) Int. Cl.
*H10W 90/00* (2026.01)
*H10H 29/14* (2025.01)

(52) U.S. Cl.
CPC .......... *H10W 90/00* (2026.01); *H10H 29/142* (2025.01)

(58) Field of Classification Search
CPC . H01L 25/0753; H10H 29/142; H10W 90/00; G09G 2300/026; G09G 2300/04; G02F 1/13336
See application file for complete search history.

(56) References Cited

U.S. PATENT DOCUMENTS

2023/0122136 A1* 4/2023 Zhang ................. G02F 1/13336
                                                            362/97.1
2024/0321835 A1* 9/2024 Cui ...................... H10H 20/857
2024/0346961 A1* 10/2024 Fu .......................... G09F 9/3026

FOREIGN PATENT DOCUMENTS

CN          112530926 A      3/2021
CN          113178139 A      7/2021
CN          114038334 A      2/2022
CN          114078928 A      2/2022
CN          115497384 A      12/2022

OTHER PUBLICATIONS

First Office Action (with English translation) for Chinese Application No. 202310483805.5, filed Apr. 28, 2023; 14 pages total.

* cited by examiner

*Primary Examiner* — Ratisha Mehta
(74) *Attorney, Agent, or Firm* — Christensen O'Connor Johnson Kindness PLLC

(57) ABSTRACT

A display panel and a display apparatus are provided. The display panel includes at least two sub-panels spliced with each other. A medium material is filled between two adjacent sub-panels. A lateral surface of the sub-panel in contact with the medium material is defined as a splicing surface. The splicing surface of at least one of two spliced sub-panels includes grooves. In a splicing process, the medium material may flow through the grooves, so that fluidity of medium material is improved and the bubbles is prevented in medium materials, thereby reducing the visibility of splicing seams caused by light scattering at bubbles.

15 Claims, 9 Drawing Sheets

10

M

DISPLAY PANEL AND DISPLAY APPARATUS

CROSS-REFERENCE TO RELATED APPLICATION

The present application claims priority to Chinese Patent Application No. 202310483805.5, filed on Apr. 28, 2023, the content of which is incorporated herein by reference in its entirety.

TECHNICAL FIELD

The present disclosure relates to the field of display technologies, and in particular, relates to a display panel and a display apparatus.

BACKGROUND

At present, a large-size display panel such as an advertising board is usually formed by splicing multiple small-size display panels. When splicing the small-size display panels, backplanes of the display panels are not continuous at a splicing position, and there are splicing seams visible to human eyes. The splicing seam at the splicing position affects overall display effect.

SUMMARY

One aspect of the present disclosure provides a display panel. The display panel includes at least two sub-panels spliced with each other with a medium material filled between adjacent sub-panels. A lateral surface of each sub-panel in contact with the medium material is defined as a splicing surface. The splicing surface of at least one of two spliced sub-panels includes a groove.

Another aspect of the present disclosure provides a display apparatus. The display apparatus includes a display panel. The display panel includes at least two sub-panels spliced with each other with a medium material filled between adjacent sub-panels. A lateral surface of each sub-panel in contact with the medium material is defined as a splicing surface. The splicing surface of at least one of two spliced sub-panels includes a groove.

BRIEF DESCRIPTION OF DRAWINGS

In order to more clearly explain the embodiments of the present disclosure or the technical solution in the related art, the drawings used in the description of the embodiments or the related art will be briefly described below. The drawings in the following description are some embodiments of the present disclosure. For those skilled in the art, other drawings can also be obtained based on these drawings.

DESCRIPTION OF EMBODIMENTS

In order to better understand objectives, technical solutions and advantages of the present disclosure, the technical solutions in the embodiments of the present disclosure are clearly and completely described in detail with reference to the accompanying drawings. The described embodiments are merely part of the embodiments of the present disclosure rather than all of the embodiments. All other embodiments obtained by those skilled in the art based on the embodiments of the present disclosure shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

Conventionally, small-size panels are spliced by adhesive material disposed between the small-size panels, and the splicing seam between the two spliced panels is an elongated shape, and the width of the splicing seam is narrow (generally smaller than ½ or ⅕ of a pixel size). It is difficult to fill the adhesive material well in the narrow splicing seam, and the adhesive material is prone to generate bubbles when splicing. The bubbles at the splicing seam will cause light scattering, causing visibility of the splicing seam and thus affecting the display effect.

The present disclosure provides a display panel. One or more grooves are arranged on a splicing surface of the spliced sub-panels. The groove may function as a channel for flow of medium materials between two spliced sub-panels. The grooves can help the flow of medium materials and help to prevent the formation of bubbles at the splicing seam, thereby reducing visibility of the splicing seam caused by light scattering at bubbles.

Embodiments of the present disclosure provide a display panel including at least two sub-panels spliced with each other. The display panel includes n*m sub-panels arranged in n rows and m columns. Both n and m are positive integers, and at least one of n and m is greater than 1. For example, when n=1 and m=2, the display panel includes 2 sub-panels. For another example, when n=2 and m=2, the display panel includes 4 sub-panels. Embodiments of the present disclosure do not limit the number of sub-panels of the display panel. When the size of sub-panel is fixed, the larger the number of the sub-panels is, the larger the final size of the display panel is.

Figures 1, 2, 3:
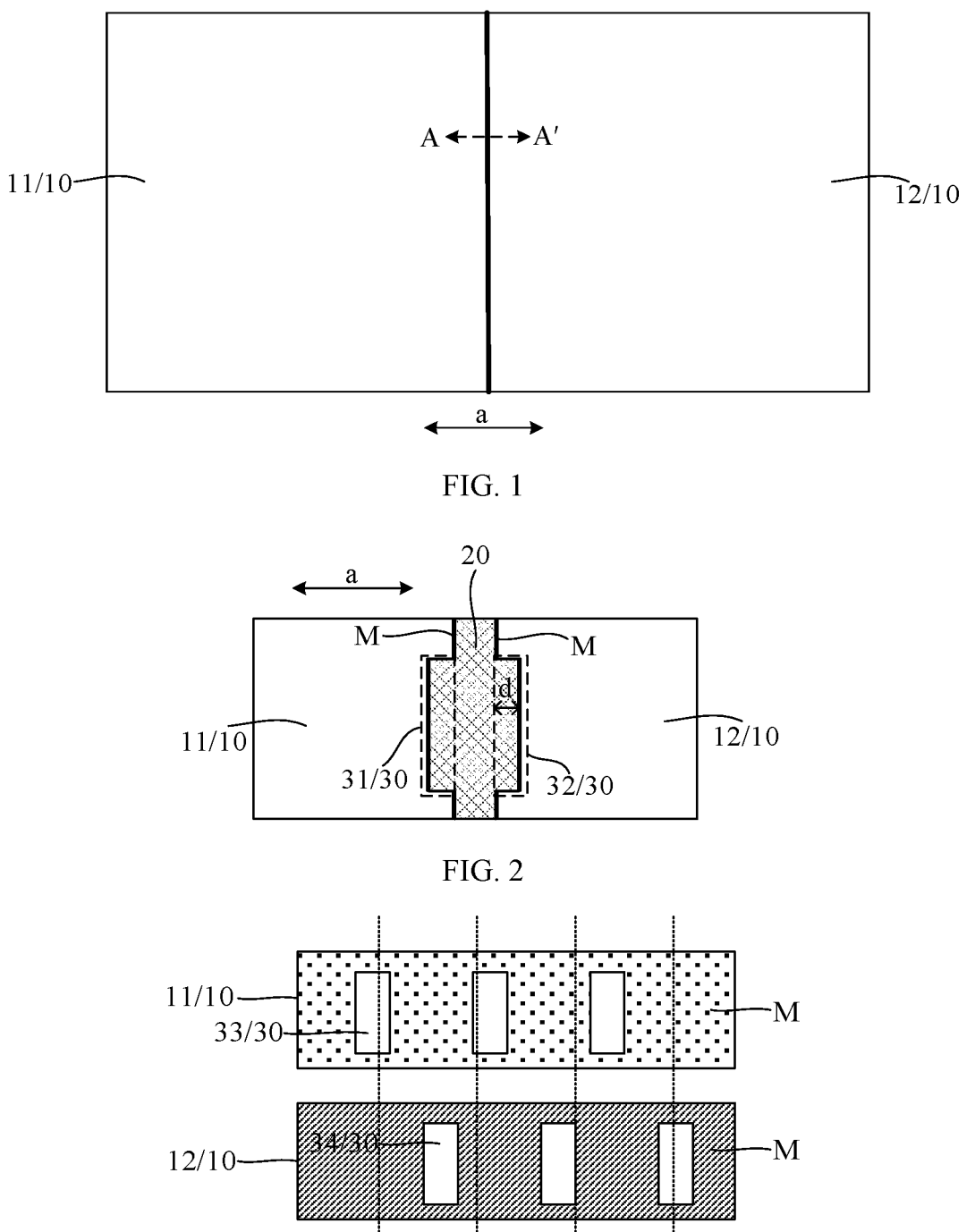
FIG. 1 is a schematic diagram of a display panel according to some embodiments of the present disclosure.
FIG. 2 is a cross-sectional view taken along line A-A' in FIG. 1 according to some embodiments of the present disclosure.
FIG. 3 is a schematic diagram of a display panel according to some embodiments of the present disclosure.

Taking n=1, m=2, and the display panel including two sub-panels as an example. FIG. 1 is a schematic diagram of a display panel according to some embodiments of the present disclosure. FIG. 2 is a cross-sectional view taken along line A-A' in FIG. 1 according to some embodiments of the present disclosure. FIG. 1 is a top view of the display panel. Referring to FIG. 1 and FIG. 2, two adjacent sub-panels 10 in the display panel are spliced with each other, and a medium material 20 is filled between the two spliced sub-panels 10. The medium material 20 is viscous, so that the spliced two sub-panel 10 are adhered into a one piece. A lateral surface of the sub-panel 10 in contact with the medium material 20 is defined as a splicing surface M. Taking a rectangular sub-panel 10 as an example, if the sub-panel 10 has one splicing surface M, the sub-panel 10 is spliced with only another one sub-panel 10, if the sub-panel 10 has two splicing surfaces M, the sub-panel 10 is spliced with another two sub-panels 10. The splicing surface M of at least one of the two spliced sub-panels 10 includes a groove 30. As shown in FIG. 2, the medium material 20 is accommodated in the groove 30. In other words, part of the medium material 20 extruded between two splicing surfaces M is accommodated in the groove 30.

The display panel provided by the embodiments of the present disclosure can be manufactured by applying an adhesive and then splicing the display panel. First, a lateral surface (the splicing surface M after splicing) of the sub-panel 10 to be spliced is coated with medium material 20, and then the lateral surfaces of the sub-panels 10 that is coated with the medium material 20 are aligned and spliced. The splicing of the display panel may also be a process of first aligning and then splicing. First, two sub-panels 10 to be spliced are aligned, so that two lateral surfaces of the two sub-panels 10 are opposite to each other, and then the medium material 20 is filled between the two opposite lateral surfaces, so that the two sub-panels 10 are adhered through the medium material 20.

FIG. 2 schematically shows that each of two splicing surfaces M of the two sub-panels 10 is disposed with a groove 30. In some embodiments of the present disclosure, the splicing surface M of only one of the two spliced sub-panels is provided with the groove 30, such embodiment is not shown in the drawings.

Embodiments of the present disclosure provide a display panel including at least two sub-panels 10 spliced with each other. The splicing surface M of at least one of two spliced sub-panels 10 is provided with one or more grooves 30. During the splicing process of the two sub-panels 10, the medium material 20 may flow through the groove 30, which improves the fluidity of the medium material 20 during the splicing process. Therefore, the medium material 20 can be well filled between the two sub-panels 10, bubbles generated by poor fluidity of the medium material 20 are avoided, i.e., the light scattering of bubbles can be avoided, thereby reducing the visibility of the splicing seam caused by the light scattering of bubbles and improving overall display effect.

In some embodiments of the present disclosure, as shown in FIG. 2, two opposite splicing surfaces M of the two spliced sub-panels 10 each include a groove 30. Such configuration can increase the flowing channel for the medium material 20 between two spliced sub-panels 10, which is more conducive to the flow of the medium material 20 in the splicing process, ensuring that the medium material 20 is well filled without bubbles between two sub-panels 10, and reducing the visibility of the splicing seam caused by the light scattering of bubbles.

In some embodiments of the present disclosure, the two sub-panels 10 shown in FIG. 1 are a first sub-panel 11 and a second sub-panel 12, and a direction a shown in FIG. 1 is a splicing direction of the first sub-panel 11 and the second sub-panel 12. The splicing direction of the two sub-panels 10 is an arrangement direction of the two spliced sub-panels 10. The grooves 30 include a first groove 31 and a second groove 32. The splicing surface M of the first sub-panel 11 includes a first groove 31, and the splicing surface M of the second sub-panel 12 includes a second groove 32. As shown in FIG. 2, the first groove 31 overlaps the second groove 32 along the splicing direction a of the first sub-panel 11 and the second sub-panel 12. Such configuration can make an overlapping area of the first groove 31 and the second groove 32 larger, thus facilitating the flow of the medium material 20 at the overlapping position.

FIG. 3 is a schematic diagram of a display panel according to some embodiments of the present disclosure. FIG. 3 shows two sub-panels 10 in the un-spliced state, and shows two splicing surfaces M of the two sub-panels 10 and a staggering relationship of grooves on two splicing surfaces M after being spliced. In some embodiments, as shown in FIG. 3, the sub-panels 10 include a first sub-panel 11 and a second sub-panel 12 that are spliced against each other. The splicing surface M of the first sub-panel 11 includes a third groove 33, and the splicing surface M of the second sub-panel 12 includes a fourth groove 34. A dotted line in FIG. 3 indicates a splicing and aligning position of the first sub-panel 11 and the second sub-panel 12. It can be understood that after splicing and aligning the first sub-panel 11 and the second sub-panel 12, the third groove 33 and the fourth groove 34 do not overlap along the splicing direction of the first sub-panel 11 and the second sub-panel 12. The third groove 33 and the fourth groove 34 are staggered. The third groove 33 and the fourth groove 34 respectively form channels for the flow of the medium material 20 at different positions. Such configuration can form more channels, improving the flow of the medium material 20. This is conducive to the uniform flow of the medium material 20 at multiple positions between two sub-panels 10 in the splicing process. In addition, this embodiment can further reduce the number of grooves 30 disposed on a single splicing surface M, so that disposing grooves 30 on the splicing surface M has less impact on the overall structure of the display panel, being easy to manufacture.

Figure 4:
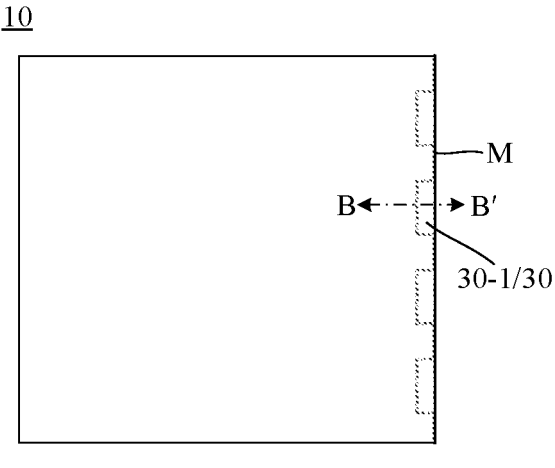
FIG. 4 is a schematic diagram of a display panel according to some embodiments of the present disclosure.
Figure 5:
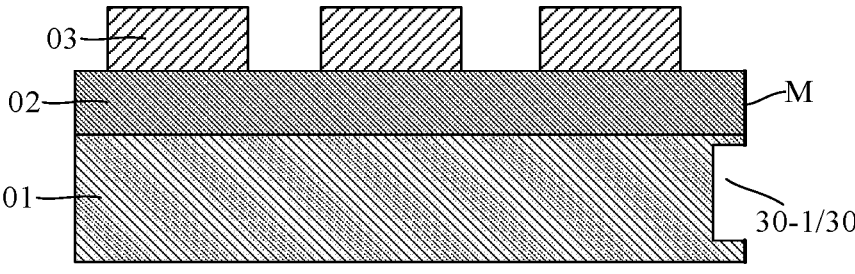
FIG. 5 is a cross-sectional view taken along line B-B' in FIG. 4 according to some embodiments of the present disclosure.

FIG. 4 is a schematic diagram of a display panel according to some embodiments of the present disclosure. FIG. 5 is a cross-sectional view taken along line line B-B' in FIG. 4 according to some embodiments of the present disclosure. FIG. 4 shows a top view of one sub-panel 10, in which the splicing surface M of the sub-panel 10 is shown, and the groove 30 formed on the splicing surface M is shown by a dotted line. The light-emitting element in the sub-panel 10 is not shown in FIG. 4. As shown in FIG. 5, the sub-panel 10 is included a substrate 01, a driving layer 02 and a light-emitting element 03. Optionally, the substrate 01 is a rigid substrate, such as a glass substrate. A thickness of the substrate 01 can be 0.4 mm to 0.8 mm, e.g., 0.5 mm or 0.7 mm. The driving layer 02 includes a pixel circuit. The pixel circuit is configured to drive the light-emitting element 03 to emit light. The light-emitting element 03 may be a light-emitting diode. The lateral surface of the substrate 01 and the lateral surface of driving layer 02 form the splicing surface M of the sub-panel 10. The groove includes a first sub-groove 30-1. The first sub-groove 30-1 is formed by recessing from a lateral surface of the substrate 01 toward interior of the substrate 01. The first sub-groove 30-1 is named according to its layer position in the sub-panel 10. The first groove to the fourth groove mentioned above are named for illustrating relative positions of the grooves 30 on the two spliced sub-panels 10. The first groove to the fourth groove mentioned above may be the first sub-groove 30-1. In this embodiment, the first sub-groove 30-1 is formed on the lateral surface of the substrate 01, and the substrate 01 mainly plays a role of supporting and bearing in a stacked layer structure of the sub-panel 10, while the functional structure for realizing display is not involved in the substrate 01. Forming the first sub-groove 30-1 on the lateral surface of the substrate 01 has little impact on the overall structure of the sub-panel 10. In addition, the thickness of the substrate 01 is relatively thick, so that the process of forming the first sub-groove 30-1 is easy to achieve.

In some embodiments of the present disclosure, the first sub-groove 30-1 may be formed on the lateral surface of the substrate 01 by grinding or laser filamentation.

Figure 6:
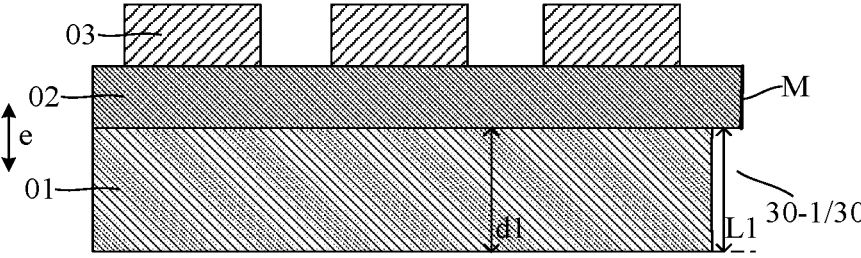
FIG. 6 is another cross-sectional view taken along line B-B' in FIG. 4 according to some embodiments of the present disclosure.
Figure 7:
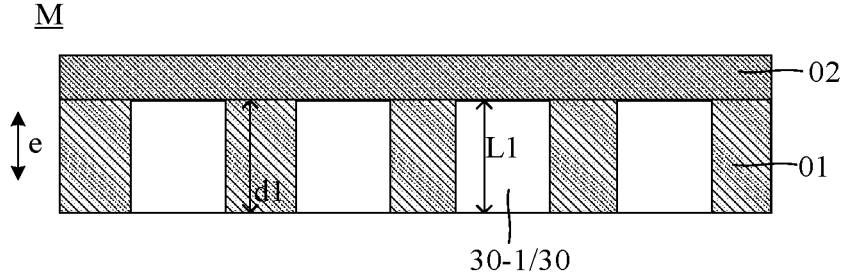
FIG. 7 is a schematic diagram of a splicing surface of a sub-panel in FIG. 4 according to some embodiments of the present disclosure.

FIG. 6 is a cross-sectional view taken along line B-B' in FIG. 4 according to some embodiments of the present disclosure. FIG. 7 is a schematic diagram of a splicing surface of the sub-panel in FIG. 4 according to some embodiments of the present disclosure. In some embodiments of the present disclosure, referring to FIG. 6 and FIG. 7, a length L1 of the first sub-groove 30-1 is equal to a thickness D1 of the substrate 01 along a direction e perpendicular to a plane of the sub-panel 10. The direction e perpendicular to the plane of the sub-panel 10 is the thickness direction of the substrate 01. In other words, the first sub-groove 30-1 runs through substrate 01 in the thickness direction of the substrate 01. Such configuration makes the length of the first sub-groove 30-1 be longest in the thickness direction of the substrate 01, thus extending the length of the flowing channel of the medium material 20 in the direction e, and increasing the accommodating space of the first sub-groove 30-1, which is beneficial to increasing the flowing channel of the medium material 20. As a result, the medium material 20 is well filled between the two sub-panels 10 without bubbles, thus reducing the visibility of the splicing seam caused by the light scattering of the bubbles.

Figure 8:
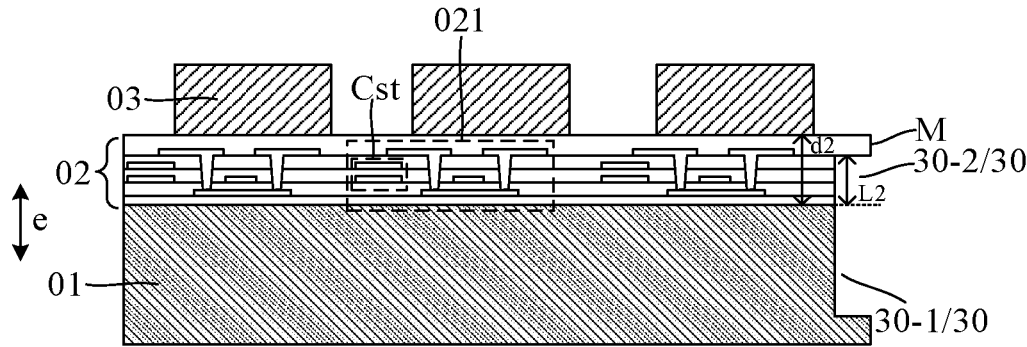
FIG. 8 is another cross-sectional view taken along line B-B' in FIG. 4 according to some embodiments of the present disclosure.

FIG. 8 is a cross-sectional view taken along line B-B' in FIG. 4 according to some embodiments of the present disclosure. In some embodiments of the present disclosure, as shown in FIG. 8, the groove 30 includes a second sub-groove 30-2. The second sub-groove 30-2 communicates with the first sub-groove 30-1 along the direction e perpendicular to the plane of the sub-panel 10. The second sub-groove 30-2 is formed by recessing from the lateral surface of the driving layer 02 into the interior of the driving layer 02. The second sub-groove 30-2 is named according to its layer position in the sub-panel 10. The first groove to the fourth groove mentioned above each may be formed by the first sub-groove 30-1 and the second sub-groove 30-2 communicating with each other. In this embodiment, the first sub-groove 30-1 formed on the lateral surface of the substrate 01 communicates with the second sub-groove 30-2 formed on the lateral surface of the driving layer 02, which increases the length of the groove 30 on the splicing surface M in the direction e, extends the length of the flowing channel of the medium material in the direction e, and is more conducive to the flow of the medium material 20 in the splicing process, so that the medium material 20 is well filled between the two sub-panels 10 to prevent generation of bubbles.

The driving layer 02 includes conductive layers on the substrate 01 and an insulating layer between adjacent conductive layers. The conductive layer forms a functional structure in the driving layer 02. Multiple insulating layers are stacked at the end of the sub-panel 10 adjacent to the splicing surface M, i.e., the lateral surfaces of the multiple stacked insulating layers form the lateral surface of the driving layer 02. In the embodiments of the present disclosure, the second sub-groove 30-2 is formed by recessing from the lateral surface of the driving layer 02 toward the interior of the driving layer 02, that is, the lateral surface of at least one insulating layer is recessed toward the interior of the at least one insulating layer to form the second sub-groove 30-2.

In some embodiments of the present disclosure, the light-emitting element 03 is a light-emitting diode, e.g., a micro light-emitting diode (Micro LED). The light-emitting element 03 is encapsulated after the Micro LED is transferred on the driving layer 02 of the sub-panel 10. Groove 30 on the splicing surface of the sub-panel 10 is then formed. In some embodiments of the present disclosure, the transfer process of the Micro LED may also be carried out after the grooves are formed on the lateral surfaces of the driving layer 02 and the substrate 01.

As shown in FIG. 8, the driving layer 02 includes pixel circuits 021. The pixel circuit 021 includes a transistor and a storage capacitor Cst. The driving layer 02 further includes multiple signal lines which at least include a scan line, a data line, a power line and a light-emitting control line. The driving layer 02 at least includes a semiconductor layer located above the substrate 01, a first metal layer, a second metal layer, a third metal layer, and insulating layers between the above layers. An active layer of the transistor is located in the semiconductor layer, a gate of the transistor is located in the first metal layer, a first plate of the storage capacitor Cst is located in the first metal layer, and a second plate of the storage capacitor Cst is located in the second metal layer. The scan line is located in the first metal layer. The light-emitting control line is located in the second metal layer. The power line and the data line are located in the third metal layer.

In some embodiments of the present disclosure, the driving layer 02 includes a semiconductor layer, a first metal layer, a second metal layer, a third metal layer and a fourth metal layer that are located on the substrate 01. The scan line is located in the first metal layer. The light-emitting control line is located in the second metal layer. A positive power line and the data line are located in the third metal layer. A negative power line is manufactured in the fourth metal layer. The positive power line provides a positive power signal for the pixel circuit 021. The first electrode of the light-emitting element 03 is connected to the pixel circuit 021, and the second electrode of the light-emitting element 03 is connected to the negative power line. The negative power line provides a negative power signal.

In some embodiments of the present disclosure, as shown in FIG. 8, a length L2 of the second sub-groove 30-2 is smaller than a thickness D2 of the driving layer 02 along a direction e perpendicular to a plane of the sub-panel 10. That is, along a thickness direction of the driving layer 02, the second sub-groove 30-2 does not run through the driving layer 02. Part of the insulating layers are retained above the second sub-groove 30-2 to ensure the integrity of the surface at a side of the driving layer 02 away from the substrate 01. The structure above the driving layer 02 is not affected by the grooves. For example, in some embodiments of the present disclosure, the light-emitting element 03 overlaps with groove 30 and does not need to avoid the light-emitting element 03 when disposing the groove 30, and the arrangement manner of the light-emitting element 03 does not need to be changed due to the presence of the groove 30, so that the arrangement of the light-emitting elements 03 at the splicing position of two sub-panels 10 will not be affected, thereby avoid affecting the display effect caused by the change of arrangement of the light-emitting elements 03.

Figure 9:
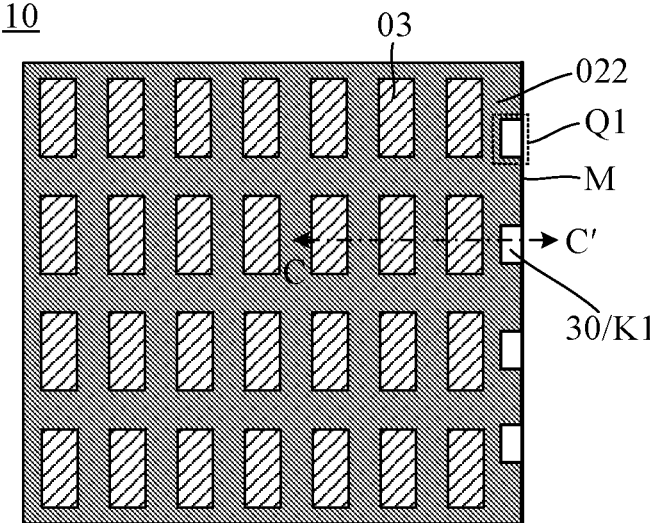
FIG. 9 is a schematic diagram of a display panel according to some embodiments of the present disclosure.
Figures 10, 11:
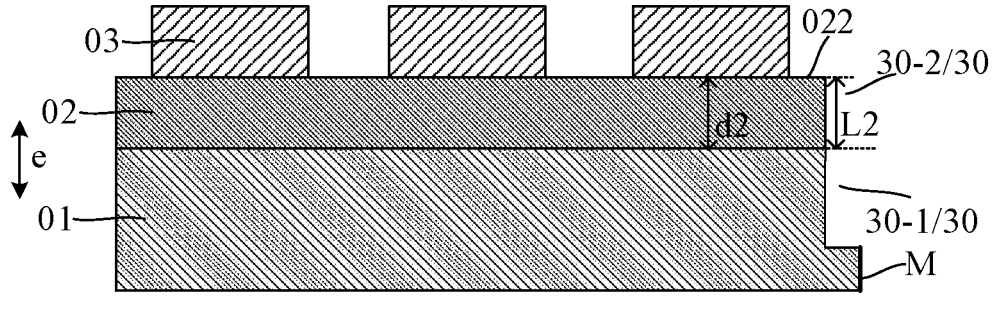
FIG. 10 is a cross-sectional view taken along line C-C' in FIG. 9 according to some embodiments of the present disclosure.
FIG. 11 is a schematic diagram of a display panel according to some embodiments of the present disclosure.

FIG. 9 is a schematic diagram of a display panel according to some embodiments of the present disclosure. FIG. 10 is a cross-sectional view taken along line C-C' in FIG. 9 according to some embodiments of the present disclosure. FIG. 9 shows a top view of a sub-panel 10, and the arrangement of light-emitting elements 03 shown in FIG. 9 is only a schematic representation and does not limit the present disclosure. Referring to FIG. 9 and FIG. 10, along a direction e perpendicular to a plane of the sub-panel 10, the groove 30 includes the first sub-groove 30-1 and the second sub-groove 30-2 that communicates with each other, and a length L2 of the second sub-groove 30-2 is equal to a thickness D2 of the driving layer. Such configuration makes the length of the second sub-groove 30-2 be longest in the thickness direction of the driving layer, extends the length of the flowing channel of the medium material 20 in the direction e, increases the accommodating space of the second sub-groove 30-2, and is beneficial to increasing the flowing channel of the medium material 20.

As shown in FIG. 9 and FIG. 10, along a direction e perpendicular to a plane of the sub-panel 10, a length L2 of the second sub-groove 30-2 is equal to a thickness D2 of the driving layer, so that an upper surface 022 of the driving layer 02 at a side away from the substrate 01 (as shown in FIG. 9) will expose the second sub-groove 30-2. In FIG. 9, region Q1 shown in FIG. 9 is a region where the upper surface 022 exposes the second sub-groove 30-2, and the upper surface 022 exposes a first opening K1 of the second sub-groove 30-2. The first opening K1 does not overlap with the light-emitting element 03.

In some embodiments of the present disclosure, the groove 30 is formed by recessing from the lateral surface of the sub-panel 10 toward the interior of the sub-panel 10. In the direction e perpendicular to the plane of the sub-panel 10, the light-emitting element 03 does not overlap with groove 30. In some embodiments of the present disclosure, the upper surface of the driving layer 02 away from the substrate 01 does not expose the groove 30. As shown in FIG. 5 or FIG. 6, groove 30 is formed by recessing from the lateral surface of the substrate 01 toward the interior of the substrate 01 in the sub-panel 10. The groove 30 does not overlap with the light-emitting element 03. The groove 30 is formed on the lateral surface of the substrate 01. The pixel circuit connected to light-emitting element 03 is usually disposed below the light-emitting element 03. The light-emitting element 03 does not overlap with the groove 30, so the support of the substrate 01 to the pixel circuit in driving layer 02 is not affected by the groove 30. As shown in FIG. 8, the groove 30 is formed by recessing from the lateral surface of the substrate 01 in the sub-panel 10 toward the interior of the substrate 01 together with recessing from the lateral surfaces of some layers in the driving layer 02 toward the interior of the driving layer 02, and the groove 30 does not overlap with the light-emitting element 03. The lateral surfaces of some layers in the driving layer 02 form the second sub-groove 30-2, and the pixel circuit connected to the light-emitting element 03 is usually disposed below the light-emitting element 03. The light-emitting element 03 does not overlap with the groove 30, so that the arrangement of pixel circuits in the driving layer 02 is not affected by the groove 30. In some embodiments of the present disclosure, the upper surface of the driving layer 02 at a side away from the substrate 01 exposes the groove 30. As shown in FIG. 9 and FIG. 10, recessing from the lateral surfaces of some layers in the driving layer 02 in the sub-panel 10 forms the second sub-groove 30-2, and the upper surface 022 of the driving layer 02 exposes the first opening K1 of the second sub-groove 30-2. The first opening K1 does not overlap with the light-emitting element 03. Such configuration can ensure that the arrangement of light-emitting elements 03 will not be affected by the groove 30, and the arrangement of the light-emitting elements 03 is not changed. In addition, the first opening K1 does not overlap with the light-emitting element 03, so that it can ensure that the light-emitting element 03 is well supported.

FIG. 11 is a schematic diagram of a display panel according to some embodiments of the present disclosure. FIG. 11 is a partial schematic diagram of the display panel and shows the splicing positions of two spliced sub-panels 10. As shown in FIG. 11, a splicing seam extending along the first direction y is formed between the two spliced sub-panels 10. The splicing seam is not marked with a reference sign in FIG. 11. It can be understood that the medium material 20 is filled between two spliced sub-panels 10, and the splicing seam is formed between the two spliced sub-panels 10. Multiple light-emitting elements 03 in the sub-panel 10 are arranged in light-emitting element columns. The light-emitting element columns extend along the first direction y and are arranged along the second direction x. The light-emitting element columns include a first light-emitting element column 03L. The light-emitting elements 03 in the first light-emitting element column 03L are equally spaced, that is, the spacing between two adjacent light-emitting elements 03 in the first light-emitting element column 03L is equal. The first light-emitting element column 03L is adjacent to the splicing surface M, that is, one light-emitting element column with a closest distance from the splicing surface M in the sub-panel 10 is the first light-emitting element column 03L. The first light-emitting element column 03L includes a first light-emitting element 03-1 and a second light-emitting element 03-2 adjacent to each other. The first opening K1 is located between the first light-emitting element 03-1 and the second light-emitting element 03-2. The first opening K1 can be understood in combination with embodiments of FIG. 9 and FIG. 10. In this embodiment, the first opening K1 is formed on the upper surface of the driving layer 02 at a side away from the substrate 01 and exposes the second sub-groove 30-2. Such configuration makes the length of the second sub-groove 30-2 be longest in the thickness direction of the driving layer 02, and can increase the length of the flowing channel of the medium material 20 in the direction e, which is beneficial to increasing the flowing channel of the medium material 20. In addition, the first opening K1 is located between the first light-emitting element 03-1 and the second light-emitting element 03-2, so the first opening K1 does not affect the equally-spaced arrangement of the light-emitting elements 03 in the first light-emitting element column 03L. It can ensure that the arrangement of the light-emitting elements 03 adjacent to the splicing seam is not changed by the groove 30, thereby not affecting the display effect at the splicing position.

In addition, as shown in FIG. 11, the light-emitting elements 03 in the sub-panel are arranged in light-emitting element rows, and the light-emitting element rows extend along in the second direction x and are arranged along the first direction y. Accordingly, the first opening K1 can also be considered to be located between two adjacent light-emitting element rows.

Figure 12:
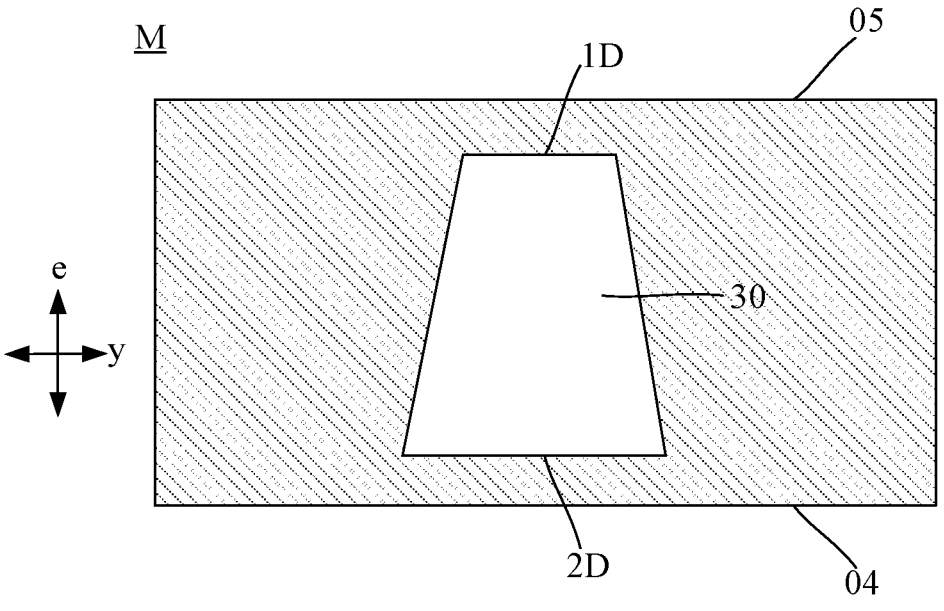
FIG. 12 is a schematic diagram of a display panel according to some embodiments of the present disclosure.

FIG. 12 is a schematic diagram of a display panel according to some embodiments of the present disclosure. FIG. 12 is a partial schematic diagram of a splicing surface M of one sub-panel 10. As shown in FIG. 12, the splicing surface M includes groove 30 which includes a first end 1D and a second end 2D. Width of the first end 1D along the first direction y is smaller than a width of the second end 2D along the first direction y. The first direction y is an extension direction of the splicing seam between the two spliced sub-panels 10, and the splicing seam can be understood in combination with the relevant description of FIG. 11. It can be understood that the splicing surface M of the sub-panel 10 has a certain length along the first direction y, and the splicing surface M also has a certain length along a direction e perpendicular to a plane of the sub-panel 10. The first direction y is perpendicular to the direction e perpendicular to the plane of the sub-panel 10.

The sub-panel 10 includes a backplane and light-emitting elements 03 located on the backplane. The backplane at least includes a substrate 01 and a driving layer 02. A lateral surface of the backplane serves as the splicing surface M of the sub-panel 10. The backplane further includes a bottom surface 04 and a top surface 05 opposite to each other, and the splicing surface M is connected between the bottom surface 04 and top surface 05. In combination with the sectional view of FIG. 8, it can be understood that the top surface of the backplane 05 is located at a side of the bottom surface 04 adjacent to the light-emitting element 03. When the backplane includes the substrate 01 and the driving layer 02, a surface of the substrate 01 at a side away from the driving layer 02 is the bottom surface 04, and a surface of the driving layer 02 at a side away from the substrate 01 is the top surface 05.

As shown in FIG. 12, the groove 30 extends along a direction from the bottom surface 04 to the top surface 05, and includes a first end 1D and a second end 2D that are opposite to each other along the extension direction. The first end 1D is located at a side of the second end 2D adjacent to the light-emitting element (not shown in FIG. 12). The first end 1D is closer to the driving layer 02, or the first end 1D is located in the driving layer 02. The smaller width of the first end 1D of the groove 30 can extend the length of the flowing channel of the medium material 20 in the direction e and reduce the impact on the circuit in the driving layer 02. Such configuration ensures that the groove 30 can better assist the flow of the medium material 20 and also help to ensure the etching uniformity during manufacturing the driving layer 02.

Figure 13:
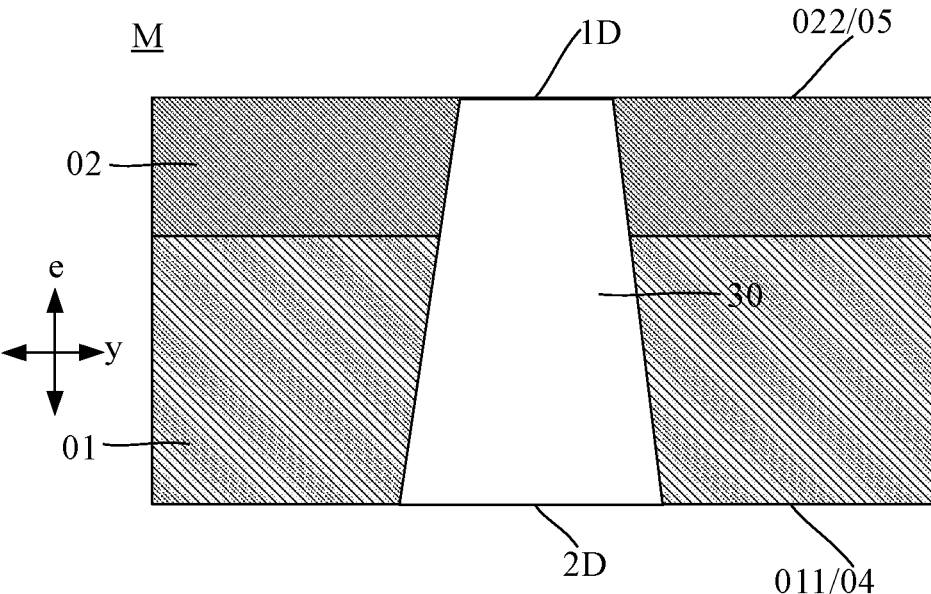
FIG. 13 is a schematic diagram of a display panel according to some embodiments of the present disclosure.

FIG. 13 is a schematic diagram of a display panel according to some embodiments of the present disclosure. FIG. 13 shows a splicing surface M of a sub-panel 10. As shown in FIG. 13, the backplane includes a substrate 01 and a driving layer 02. A lateral surface of the substrate 01 and a lateral surface of the driving layer 02 form the splicing surface M. A surface of the driving layer 02 at a side away from the substrate 01 is an upper surface 022, i.e., the top surface 05. The first end 1D is located in a same horizontal plane as the upper surface 022. The substrate 01 includes a lower surface 011. The lower surface 011 is a surface of the substrate 01 at a side away from the driving layer 02, i.e., the bottom surface 04. The second end 2D is located in a same horizontal plane as the lower surface 011. In this embodiment, the groove 30 runs through the substrate 01 and the driving layer 02 in a direction e perpendicular to a plane of the sub-panel 10. Such configuration makes the length of the groove 30 in the direction e perpendicular to the plane of the sub-panel 10 be larger, so that the length of the flowing channel of the medium material 20 in the direction e is the longest, which is more conducive to the flow of the medium material 20. Moreover, the medium material 20 is easier to be discharged from the end of the splicing surface M in the direction e, preventing bubbles generated in the splicing process. In addition, the width of the first end 1D along the first direction y is smaller than the width of the second end 2D along the first direction y, which can reduce the area of the first end 1D exposed by the top surface 05. Referring to FIG. 9, the first end 1D exposed by the top surface 05 is the first opening K1, such configuration can prevent the first end 1D of the groove from affecting the arrangement of the light-emitting elements 03, ensure that the arrangement of the light-emitting elements 03 adjacent to the splicing surface M is the same as the arrangement of the light-emitting elements 03 at other positions in the sub-panel 10, thereby avoid affecting the display effect due to the change of arrangement of the light-emitting element 03.

Figure 14:
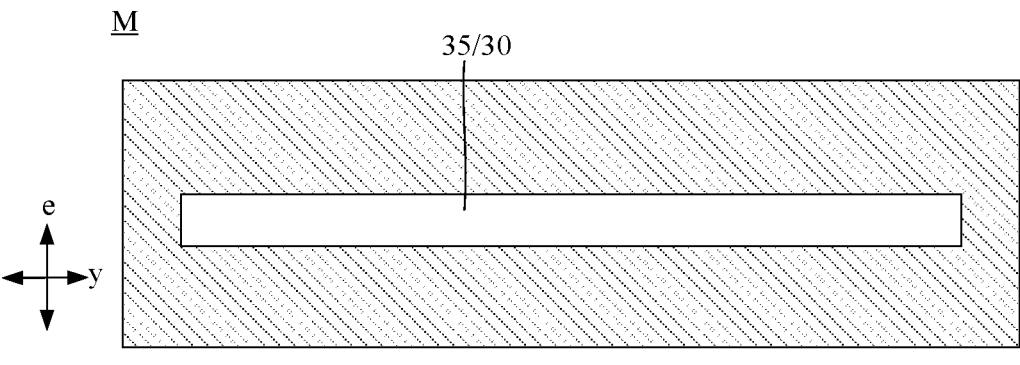
FIG. 14 is a schematic diagram of a display panel according to some embodiments of the present disclosure.

FIG. 14 is a schematic diagram of a display panel according to some embodiments of the present disclosure. FIG. 14 shows a splicing surface M of one sub-panel 10. As shown in FIG. 14, a length of the splicing surface M along the first direction y is greater than a length of the splicing surface M along a direction e perpendicular to a plane of the sub-panel 10. The first direction y is an extension direction of the splicing seam (see FIG. 11), and the direction e perpendicular to the plane of the sub-panel 10 is perpendicular to the first direction y. The grooves 30 include a fifth groove 35. A length of the fifth groove 35 along the first direction y is greater than a length of the fifth groove 35 along the direction e perpendicular to the plane of the sub-panel 10. The fifth groove 35 may be the first sub-groove shown in FIG. or FIG. 6. The fifth groove 35 may include the first sub-groove 30-1 and the second sub-groove 30-2 shown in FIG. 8.

A length of the splicing surface M along the first direction y is basically equal to a length of the sub-panel 10 along the first direction y, and the length of the splicing surface M along the direction e perpendicular to the plane of the sub-panel 10 is basically equal to the thickness of the sub-panel 10. The length of sub-panel 10 along the first direction y is much greater than the thickness of the sub-panel 10. Therefore, the length of the splicing surface M along the first direction y will be much greater than the length of the splicing surface M along the direction e perpendicular to the plane of the sub-panel 10, so the degree of freedom of disposing the grooves 30 along the first direction y is larger. The fifth groove 35 is disposed as a strip groove, and the long side of the fifth groove 35 extends along the first direction y. The fifth groove 35 improves the flow of the medium material 20 at more positions on the extension direction of the splicing seam. Moreover, the flowing channel of the medium material 20 in the fifth groove 35 along the first direction y is continuous, the flow of the medium material 20 will be smooth, and the medium material 20 can be better filled between the two sub-panels 10, avoiding the generation of bubbles.

Figure 15:
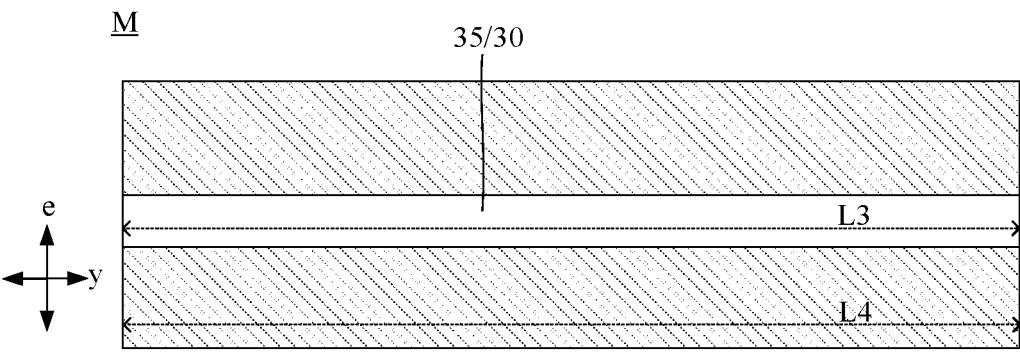
FIG. 15 is a schematic diagram of a display panel according to some embodiments of the present disclosure.

FIG. 15 is a schematic diagram of a display panel according to some embodiments of the present disclosure. FIG. 15 shows a splicing surface M of one sub-panel 10. As shown in FIG. 15, the length L3 of the fifth groove 30 along the first direction y is equal to the length L4 of the splicing surface M along the first direction y. In this embodiment, the fifth groove can facilitate the flow of the medium material 20 at various positions along the extension direction of the splicing seam. In the splicing process, the flow of the medium material 20 between two sub-panels 10 will be smooth, and the medium material 20 is easier to be discharged from the end of the splicing surface M in the first direction y, which can avoid the bubbles generated in the medium material 20, thereby reducing the visibility of the splicing seam.

Figure 16:
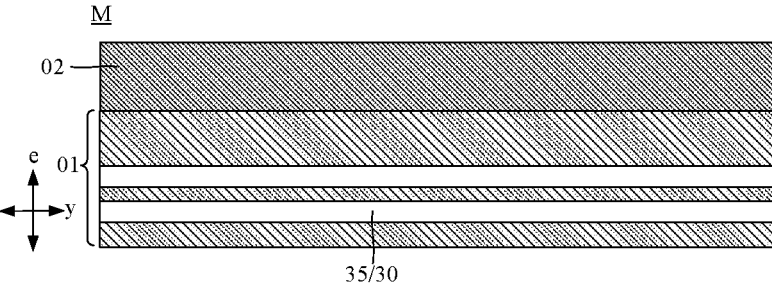
FIG. 16 is a schematic diagram of a display panel according to some embodiments of the present disclosure.

FIG. 16 is a schematic diagram of a display panel according to some embodiments of the present disclosure. In some embodiments of the present disclosure, as shown in FIG. 16, the splicing surface M is provided with two fifth grooves 35, and the two fifth grooves 35 can assist the flow of the medium material 20 at different positions along the direction e perpendicular to the plane of the sub-panel, so that the medium material 20 is well filled between the two sub-panels 10 to avoid the generation of bubbles. Optionally, the fifth groove is formed on the lateral surface of the substrate 01, i.e., the fifth groove 35 is formed by recessing inward from the lateral surface of the substrate 01.

The present disclosure does not limit the number of the fifth groove 35 formed on the splicing surface M, which can be designed according to requirements.

Figure 17:
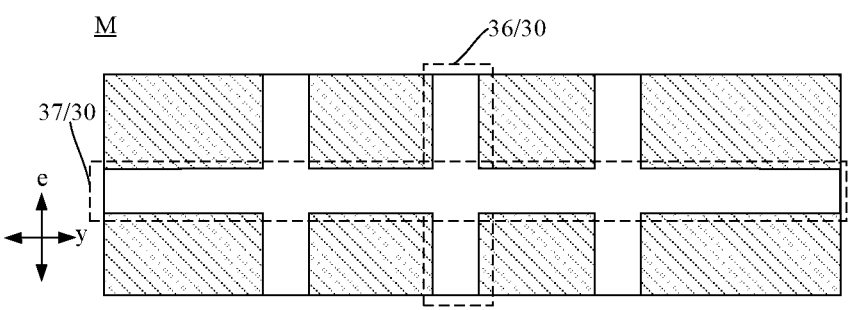
FIG. 17 is a schematic diagram of a display panel according to some embodiments of the present disclosure.

FIG. 17 is a schematic diagram of a display panel according to some embodiments of the present disclosure. FIG. 17 shows a splicing surface M of one sub-panel 10. A length of the splicing surface M along the first direction y is greater than a length of the splicing surface M along a direction e perpendicular to a plane of the sub-panel 10. The first direction y is an extension direction of the splicing seam between the two spliced sub-panels 10. The direction e is perpendicular to the first direction y. As shown in FIG. 17, the grooves 30 include a sixth groove 36 and a seventh groove 37. Length of the sixth groove 36 along the first direction y is smaller than a length of the seventh groove 37 along the first direction y. Length of the sixth groove 36 along the direction e perpendicular to the plane of the sub-panel 10 is greater than a length of the seventh groove 37 along the direction e perpendicular to the plane of the sub-panel 10. The sixth groove 36 intersects and communicates with the seventh groove 37. The seventh groove 37 may be the fifth groove shown in FIG. 14 or FIG. 15. The sixth groove 36 may be the groove 30 shown in FIG. 12 or FIG. 13, that is, the length of the sixth groove 36 along the direction e is smaller than or equal to the length of the splicing surface M along the direction e. FIG. 17 schematically shows that, the length of the seventh groove 37 along the first direction y is equal to the length of the splicing surface M along the first direction y, and the length of the sixth groove 36 along the direction e is equal to the length of the splicing surface M along the direction e. The sixth groove 36 improves the flow of the medium material 20 in the direction e in the splicing process, and the seventh groove 37 improves the flow of the medium material 20 along the first direction y in the splicing process. The sixth groove 36 intersects and communicates with the seventh groove 37, so that the medium material 20 can flow along the direction e and along the first direction y. In this way, the flow of the medium material 20 is smoother, thereby more effectively preventing bubbles generated in the splicing process.

Figure 18:
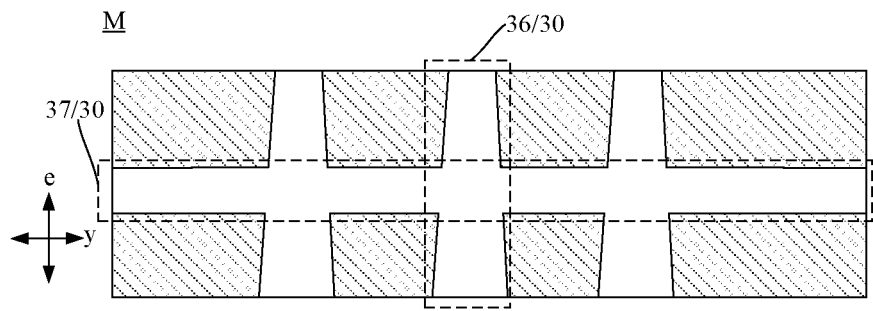
FIG. 18 is a schematic diagram of a display panel according to some embodiments of the present disclosure.

The sixth groove 36 shown in FIG. 17 is a groove with a strip shape. In some embodiments of the present disclosure, the sixth groove 36 may be a groove with a progressively changed width shown in FIG. 12 (a length along the first direction y). FIG. 18 is a schematic diagram of a display panel according to some embodiments of the present disclosure. As shown in FIG. 18, the sixth groove 36 intersects and communicates with the seventh groove 37, the length of the sixth groove 36 along the first direction y is the width of the sixth groove 36, and the width of the sixth groove 36 progressively changes along the direction e.

Figure 19:
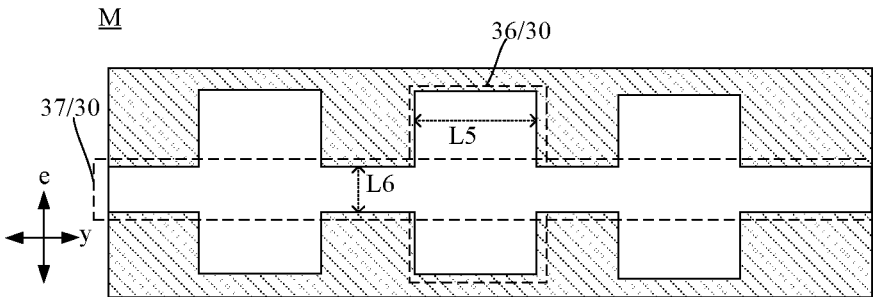
FIG. 19 is a schematic diagram of a display panel according to some embodiments of the present disclosure.

FIG. 19 is a schematic diagram of a display panel according to some embodiments of the present disclosure. In some embodiments of the present disclosure, as shown in FIG. 19, a length of the sixth groove 36 along the first direction y is defined as L5, and a length of the seventh groove 37 along a direction e perpendicular to a plane of the sub-panel 10 is defined as L6. L5 is greater than L6. The length of the splicing surface M along the first direction y is larger than the length of the splicing surface M along the direction e, so that the space for arranging the seventh groove 37 in the direction e is relatively small, while the space for arranging the sixth grooves 36 in the first direction y is relatively large. The length L5 of the sixth groove 36 along the first direction y is set large, which is conducive to increasing the flowing space of the medium material 20 in the sixth groove 36 along the first direction y, so that the sixth groove 36 is more conducive to the flow of the medium material 20. In addition, since the length of the sixth groove 36 along the direction e is larger than the length of the seventh groove 37 along the direction e, compared with the seventh groove 37, the sixth groove 36 can assist the flow of the medium material 20 at more positions along the direction e. Moreover, the length of the sixth groove 36 along the first direction y is set large, so that the sixth groove 36 can act on a wider range of the medium material 20, which is more conducive to the flow of the medium material 20.

Figure 20:
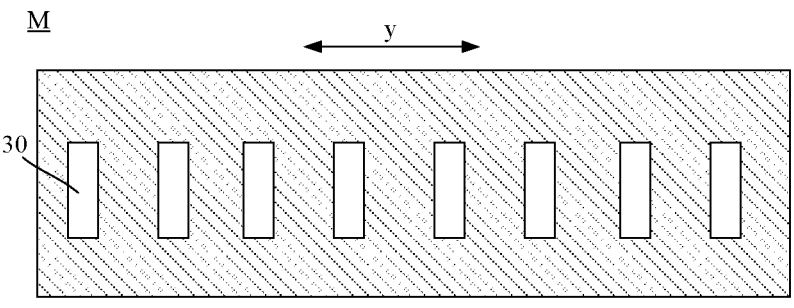
FIG. 20 is a schematic diagram of a display panel according to some embodiments of the present disclosure.

FIG. 20 is a schematic diagram of a display panel according to some embodiments of the present disclosure. In some embodiments of the present disclosure, as shown in FIG. 20, on the splicing surface M, multiple grooves 30 are arranged along the first direction y. The first direction y is an extension direction of the splicing seam between two spliced sub-panels 10. Multiple grooves 30 are arranged on the splicing surface M along the first direction y. The multiple grooves 30 are respectively used as channels to assist the flow of the medium material 20 at different positions, thus ensuring that no bubbles are generated at various positions of the splicing seam.

Figure 21:
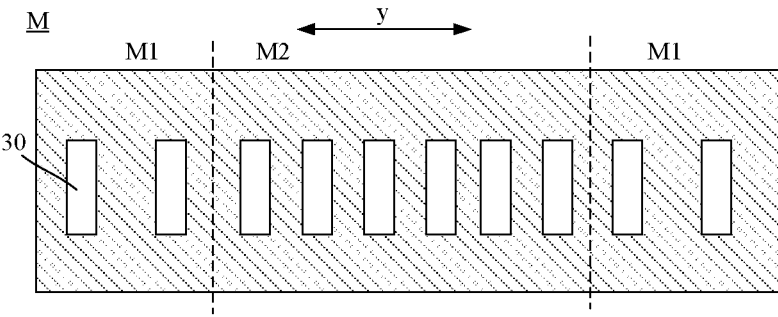
FIG. 21 is a schematic diagram of a display panel according to some embodiments of the present disclosure.

FIG. 21 is a schematic diagram of a display panel according to some embodiments of the present disclosure. In some embodiments of the present disclosure, as shown in FIG. 21, along the first direction y, the splicing surface M includes two ends M1 and an intermediate part M2 between the two ends M1. The disposing density of the grooves 30 in the intermediate part M2 is greater than the disposing density of the grooves 30 in the end M1. When the two sub-panels 10 are spliced with each other, the medium material 20 in contact with the end M1 of the splicing surface M is easier to be discharged from the edge of the end M1, while the medium material 20 in contact with the intermediate part M2 is relatively difficult to be discharged. The disposing density of grooves 30 in the intermediate part M2 is higher, and the grooves 30 with high density can form more channels to ensure that the medium material 20 in contact with the intermediate part M2 will not generate bubbles. The disposing density of the grooves 30 in the end M1 is lower, so that the medium material 20 in contact with the end M1 can not only be discharged from the edge of the end M1, but also flow in the flowing channel formed by the groove 30, thus ensuring that the medium material in contact with the end M1 will not generate bubbles. In this embodiment, the disposing density of the grooves 30 in the intermediate part M2 and the disposing density of the grooves in the end M1 are different, which can balance the difference between the discharging ability of the medium material 20 in the intermediate part M2 and the discharging ability of the medium material 20 in the end M1, therefore ensuring that the medium material 20 at the splicing seam does not generate bubbles.

The example shapes of the groove 30 in FIG. 20 and FIG. 21 is for illustration only. The groove 30 shown in FIG. 20 and FIG. 21 may be the groove of one or more above embodiments.

Figure 22:
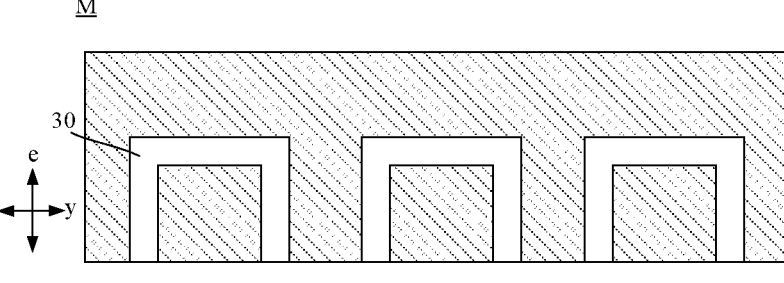
FIG. 22 is a schematic diagram of a display panel according to some embodiments of the present disclosure.

FIG. 22 is a schematic diagram of a display panel according to some embodiments of the present disclosure. In some embodiments of the present disclosure, as shown in FIG. 22, the groove 30 has a "U" shape. The "U" shape opens toward the bottom side of the sub-panel 10. The bottom side of sub-panel 10 is also a side of the sub-panel 10 away from a light exiting surface. The "U" shape groove 30 can help the flowing of the medium material 20 both in the first direction y and the direction e, so that the medium material 20 flows in the two directions, the flow of the medium material 20 is smoother, and bubbles generated due to poor flow of the medium material 20 in the splicing process can be avoided. In addition, when the bottom side of the sub-panel 10 exposes the opening of the groove 30, the medium material 20 flowing in the groove 30 can be discharged from the opening at the bottom side of the groove, thereby being more conducive to the flow of the medium material 20.

Figure 23:
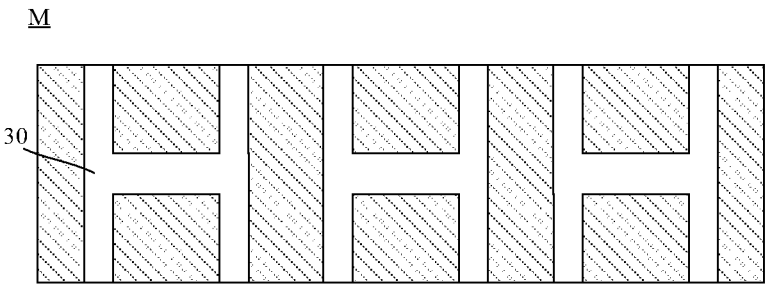
FIG. 23 is a schematic diagram of a display panel according to some embodiments of the present disclosure.

FIG. 23 is a schematic diagram of a display panel according to some embodiments of the present disclosure. In some embodiments of the present disclosure, as shown in FIG. 23, the groove 30 is of an "H" shape. The groove 30 with the "H" shape can increase the flow paths of the medium material 20 in the groove 30, and the channels in the groove 30 communicate with one another, so that the flow of the medium material 20 is smoother, thereby avoiding the bubble caused by the poor flow of the medium material 20 in the splicing process.

Figure 24:
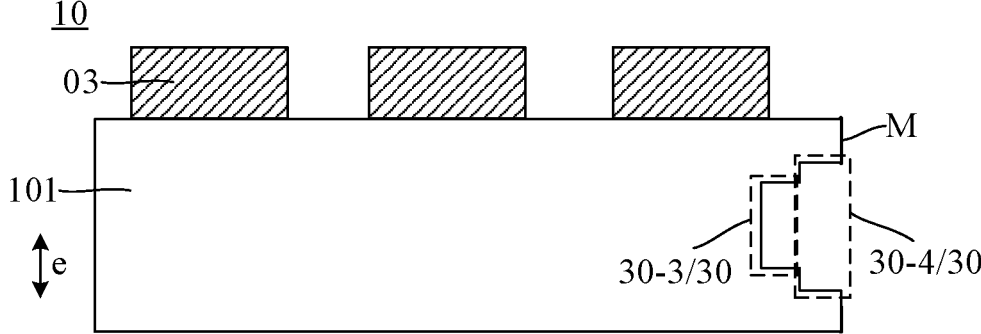
FIG. 24 is a schematic diagram of a display panel according to some embodiments of the present disclosure.

FIG. 24 is a schematic diagram of a display panel according to some embodiments of the present disclosure. In some embodiments of the present disclosure, as shown in FIG. 24, the sub-panel 10 includes a backplane 101. Light-emitting elements 03 are disposed on the backplane 101. A lateral surface of the backplane 101 is the splicing surface M. The backplane 101 at least includes a substrate and a driving layer. The groove 30 recesses from the splicing surface M toward interior of the sub-panel 10 to form an inner groove 30-3 and an outer groove 30-4 that communicates with each other. Compared with the outer groove 30-4, the inner groove 30-3 is closer to the interior of the sub-panel. Width of the outer groove 30-4 is greater than a width of the inner groove 30-3 along a direction e of a plane of the sub-panel 10. Disposing the inner groove 30-3 makes the extending depth of the groove 30 toward the interior of the sub-panel 10 deeper, thus making the accommodating space of the groove 30 larger, which is more conducive to the flow of the medium material 20. In addition, the inner groove 30-3 has a smaller width along the direction e, so that even if the inner groove 30-3 extends to the deeper depth inside the sub-panel, the inner groove 30-3 will not have an adverse effect on the structure layers in the sub-panel.

The groove 30 shown in FIG. 24 may be a strip groove extending in the first direction y or a groove extending in the direction e perpendicular to the plane of the sub-panel.

In some embodiments of the present disclosure, as shown in FIG. 2, a depth of the groove 30 recessing from the splicing surface M to the interior of the sub-panel 10 is defined as d, where $1 \ \mu m \leq d \leq 100 \ \mu m$. The volume of the groove 30 can be obtained by multiplying the depth d of the groove 30 with the area of the groove 30 exposed on the splicing surface M. The greater the volume of the groove 30 is, the greater the space inside the groove 30 is, which is more conducive to the flow of the medium material 20. Whether the medium material 20 can be well filled between the two sub-panels 10 is not only dependent on the volume of groove 30, but also dependents on the viscosity of the medium material 20. In application, the volume of the groove 30 can be designed according to the viscosity of the medium material 20. The bubbles generated by the material with high viscosity are more difficult to reach the surface of the material and are not easy to discharge. For the medium material 20 with high viscosity, the volume of the groove 30 can be disposed larger accordingly. For the medium material 20 with low viscosity, the volume of the groove 30 can be disposed smaller accordingly. If the area of the splicing surface M of the sub-panel 10 is large, the area of the groove 30 exposed on splicing surface M can be set large, while the depth of the groove 30 recessing to the interior is set small. Therefore, it can avoid that the excessive depth of the groove 30 recessing to the interior affects the overall structural stability while ensuring an enough large volume of the groove 30. When the groove 30 is manufactured on the lateral surface of the driving layer, that the situation where the groove 30 affects the arrangement of the circuit structure can be avoided.

In some embodiments of the present disclosure, the medium material 20 includes a transparent material. The transparent material has light transmittance performance, so the light emitted by the light-emitting element 03 near the splicing position to the medium material 20 will not be absorbed by the medium material 20. Accordingly, the brightness difference between the splicing position and other positions of the sub-panel 10 is reduced, thereby improving the display effect.

In some embodiments of the present disclosure, the medium material 20 includes a light blocking adhesive material. The light blocking adhesive material has a certain absorption effect on light. Even if the medium material 20 generates bubbles in the splicing process, the light scattered by the bubbles will also be absorbed by the light blocking adhesive material, which can reduce the visibility of the splicing seam caused by light scattering.

Figure 25:
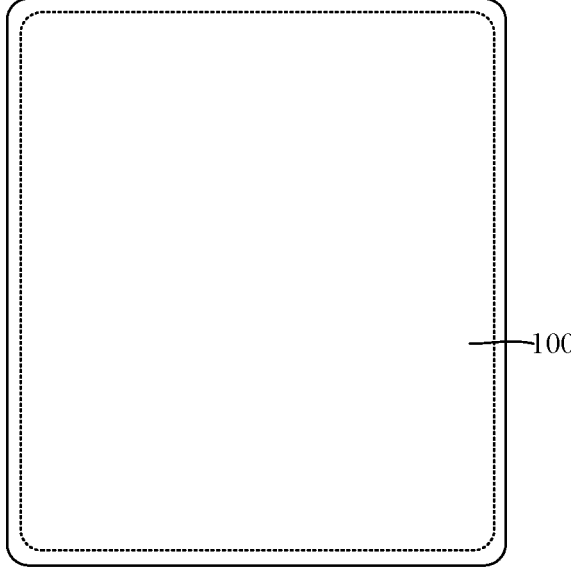
FIG. 25 is a schematic diagram of a display apparatus according to some embodiments of the present disclosure.

The present disclosure further provides a display apparatus. FIG. 25 is a schematic diagram of a display apparatus according to some embodiments of the present disclosure. As shown in FIG. 25, the display apparatus includes display panel 100 provided by any embodiment of the present disclosure. For example, the display apparatus provided by the present disclosure can be a large-size display device, e.g., an information bulletin board, an advertising board, or can be applied to transparent display, such as shop windows, windows of buildings or vehicles, or transparent TV, etc.

The above are merely some embodiments of the present disclosure, which, as mentioned above, are not used to limit the present disclosure. Any modification, equivalent substitution, improvement, etc., of the present disclosure shall fall into the protection scope of the present disclosure.

Finally, it should be noted that the technical solutions of the present disclosure are illustrated by the above embodiments, but not intended to be limit by the illustrated embodiments. Although the present disclosure has been described in detail with reference to the foregoing embodiments, those skilled in the art can understand that the present disclosure is not limited to the embodiments described herein, and can make various obvious modifications, readjustments, and substitutions without departing from the scope of the present disclosure.

What is claimed is:

1. A display panel comprising at least two sub-panels spliced with each other, wherein a medium material is filled between adjacent sub-panels, wherein a lateral surface of each sub-panel in contact with the medium material is defined as a splicing surface, and wherein the splicing surface of at least one of two spliced sub-panels comprises a groove;

wherein a splicing seam extending along a first direction is formed between two spliced sub-panels of the at least two sub-panels, each of the two sub-panels comprises a backplane and a light-emitting element located at a side of the backplane, the backplane comprises: a substrate, a driving layer, a bottom surface and a top surface opposite to the bottom surface, and the top surface is located at a side of the bottom surface adjacent to the light-emitting element, the groove extends along a direction from the bottom surface to the top surface and comprises a first end and a second end opposite to each other, and the first end is located at a side of a second side adjacent to the light-emitting element, and in a plane of the splicing surface, a width of the first end along the first direction is smaller than a width of the second end along the first direction; or wherein a splicing seam extending along a first direction is formed between two spliced sub-panels of the at least two sub-panels, and the groove comprises a plurality of grooves are arranged along the first direction on the splicing surface; and along the first direction, the splicing surface comprises two ends and an intermediate part between the two ends, and a groove density in the intermediate part is greater than a groove density in the two ends; or wherein the groove is recessed inward from the splicing surface to form an inner groove and an outer groove that communicate with each other, and along a direction perpendicular to a plane of the sub-panel, a width of the outer groove is greater than a width of the inner groove; or wherein a splicing seam extending along a first direction is formed between two spliced sub-panels of the at least two sub-panels, a length of the splicing surface along the first direction is greater than a length of the splicing surface along a direction perpendicular to a plane of the sub-panel, and the first direction is perpendicular to the direction perpendicular to the plane of the sub-panel, and the groove comprises a fifth groove, a length of the fifth groove along the first direction is greater than a length of the fifth groove along the direction perpendicular to the plane of the sub-panel, and the length of the fifth groove along the direction perpendicular to the plane of the sub-panel is smaller than a length of the splicing surface along the direction perpendicular to the plane of the sub-panel.

2. The display panel according to claim 1, wherein the at least two sub-panels comprise a first sub-panel and a second sub-panel spliced with each other, the splicing surface of the first sub-panel and the splicing surface of the second sub-panel are opposite to each other, the splicing surface of the first sub-panel comprises a first groove, the splicing surface of the second sub-panel comprises a second groove, and the first groove overlaps the second groove along a splicing direction of the first sub-panel and the second sub-panel.

3. The display panel according to claim 1, wherein the at least two sub-panels comprise a first sub-panel and a second sub-panel spliced with each other, the splicing surface of the first sub-panel and the splicing surface of the second sub-panel are opposite to each other, the splicing surface of the first sub-panel comprises a third groove, the splicing surface of the second sub-panel comprises a fourth groove, and the third groove does not overlap with the second groove along a splicing direction of the first sub-panel and the second sub-panel.

4. The display panel according to claim 1, wherein each of the at least two sub-panels comprises a substrate, and the groove comprises a first sub-groove formed by recessing inward from the lateral surface of the substrate.

5. The display panel according to claim 4, wherein the groove further comprises a second sub-groove, and the second sub-groove is communicated with the first sub-groove along a direction perpendicular to a plane of the sub-panel, and each of the at least two sub-panels further comprises a driving layer located at a side of the substrate, and the second sub-groove is formed by recessing inward from a lateral surface of the driving layer, and along the direction perpendicular to the plane of the sub-panel, a length of the second sub-groove is smaller than or equal to a thickness of the driving layer.

6. The display panel according to claim 1, wherein the groove is formed by recessing inward from the lateral surface, each of the at least two sub-panels comprises light-emitting elements, and along a direction perpendicular to a plane of the at least two sub-panels, the light-emitting elements do not overlap with the groove.

7. The display panel according to claim 6, wherein a splicing seam extending along a first direction is formed between two spliced sub-panels of the at least two sub-panels, the light-emitting elements in each of the two sub-panels are arranged in light-emitting element columns extending along the first direction and arranged along a second direction, the light-emitting element columns comprise a first light-emitting element column adjacent to the splicing surface, and light-emitting elements in the first light-emitting element column are equally spaced, and the first light-emitting element column comprises a first light-emitting element and a second light-emitting element adjacent to each other, and a first opening of the groove is located between the first light-emitting element and the second light-emitting element.

8. The display panel according to claim 1, wherein a splicing seam extending along a first direction is formed between two spliced sub-panels of the at least two sub-panels, a length of the splicing surface along the first direction is greater than a length of the splicing surface along a direction perpendicular to a plane of the sub-panel, and the first direction is perpendicular to the direction perpendicular to the plane of the sub-panel, the groove further comprises a sixth groove and a seventh groove intersecting and communicated with the sixth groove, and a length of the sixth groove along the first direction is smaller than a length of the seventh groove along the first direction, and a length of the sixth groove along the direction perpendicular to the plane of the sub-panel is greater than a length of the seventh groove along the direction perpendicular to the plane of the sub-panel.

9. The display panel according to claim 8, wherein the length of the sixth groove along the first direction is greater than the length of the seventh groove along the direction perpendicular to the plane of the sub-panel.

10. The display panel according to claim 1, wherein the groove is of a "U" shape that opens toward a bottom side of the sub-panel.

11. The display panel according to claim 1, wherein the groove is of an "H" shape.

12. The display panel according to claim 1, wherein a depth d of the groove recessing inward from the splicing surface satisfies 1 μm≤d=100 μm.

13. The display panel according to claim 1, wherein the medium material comprises a transparent material.

14. The display panel according to claim 1, wherein the medium material comprises a light blocking adhesive material.

15. A display apparatus comprising a display panel, wherein the display panel comprises: at least two sub-panels spliced with each other with a medium material filled between adjacent sub-panels, wherein a lateral surface of each sub-panel in contact with the medium material is defined as a splicing surface, and the splicing surface of at least one of two spliced sub-panels comprises a groove;

wherein a splicing seam extending along a first direction is formed between two spliced sub-panels of the at least two sub-panels, each of the two sub-panels comprises a backplane and a light-emitting element located at a side of the backplane, the backplane comprises: a substrate, a driving layer, a bottom surface and a top surface opposite to the bottom surface, and the top surface is located at a side of the bottom surface adjacent to the light-emitting element, the groove extends along a direction from the bottom surface to the top surface and comprises a first end and a second end opposite to each other, and the first end is located at a side of a second side adjacent to the light-emitting element, and in a plane of the splicing surface, a width of the first end along the first direction is smaller than a width of the second end along the first direction; or wherein a splicing seam extending along a first direction is formed between two spliced sub-panels of the at least two sub-panels, and the groove comprises a plurality of grooves are arranged along the first direction on the splicing surface; and along the first direction, the splicing surface comprises two ends and an intermediate part between the two ends, and a groove density in the intermediate part is greater than a groove density in the two ends; or wherein the groove is recessed inward from the splicing surface to form an inner groove and an outer groove that communicate with each other, and along a direction perpendicular to a plane of the sub-panel, a width of the outer groove is greater than a width of the inner groove; or wherein a splicing seam extending along a first direction is formed between two spliced sub-panels of the at least two sub-panels, a length of the splicing surface along the first direction is greater than a length of the splicing surface along a direction perpendicular to a plane of the sub-panel, and the first direction is perpendicular to the direction perpendicular to the plane of the sub-panel, and the groove comprises a fifth groove, a length of the fifth groove along the first direction is greater than a length of the fifth groove along the direction perpendicular to the plane of the sub-panel, and the length of the fifth groove along the direction perpendicular to the plane of the sub-panel is smaller than a length of the splicing surface along the direction perpendicular to the plane of the sub-panel.

* * * * *